United States Patent [19]

Holzl

[11] 4,239,819
[45] Dec. 16, 1980

[54] DEPOSITION METHOD AND PRODUCTS
[75] Inventor: Robert A. Holzl, La Canada, Calif.
[73] Assignee: Chemetal Corporation, Pacoima, Calif.
[21] Appl. No.: 968,074
[22] Filed: Dec. 11, 1978

Related U.S. Application Data

[63] Continuation-in-part of Ser. No. 797,059, May 16, 1977, abandoned, which is a continuation-in-part of Ser. No. 588,390, Jun. 18, 1975, Pat. No. 4,040,870, which is a continuation-in-part of Ser. No. 358,110, May 7, 1973, abandoned.

[51] Int. Cl.$^3$ .................................................. C23C 11/08
[52] U.S. Cl. ......................... 427/255.2; 148/6.3; 148/6.35; 148/20.6; 148/127; 148/133; 427/249; 427/253; 427/255.3; 427/314; 427/318; 428/328; 428/457; 428/469; 428/472; 428/627; 428/640; 428/641; 428/663
[58] Field of Search ............... 427/248 R, 249, 255, 427/226, 228, 253, 248 A, 248 B, 314, 318; 148/6.3, 20.6, 6.35, 133, 16.5, 127; 428/332, 469, 457, 472, 539, 328, 553, 627, 628, 629, 639, 640, 662, 663

[56] References Cited

U.S. PATENT DOCUMENTS

| | | | |
|---|---|---|---|
| 1,019,567 | 3/1912 | Weintraub | 427/248 A |
| 3,019,137 | 1/1962 | Hanlet | 427/248 A |
| 3,540,919 | 11/1970 | Bracken | 427/248 A |
| 3,656,995 | 4/1972 | Reedy | 427/248 B |
| 3,684,585 | 8/1972 | Shoup et al. | 427/249 |
| 3,888,705 | 6/1975 | Fletcher et al. | 118/715 |

*Primary Examiner*—Ronald H. Smith
*Assistant Examiner*—Janyce A. Bell
*Attorney, Agent, or Firm*—Fulwider, Patton, Rieber, Lee & Utecht

[57] ABSTRACT

A method of depositing a hard, fine grained metal or semi-metal alloy is described wherein a volatile halide of the metal or semi-metal is partially reduced and then deposited as a liquid phase intermediate compound onto a substrate in the presence of an alloying gas. The liquid phase deposited on the substrate is then thermochemically reacted to produce the hard, fine grained alloy. Also described are products which may be produced by the above method.

29 Claims, 1 Drawing Figure

DEPOSITION METHOD AND PRODUCTS

CROSS-REFERENCE TO RELATED APPLICATIONS

This application is a continuation-in-part of application Ser. No. 797,059, filed May 16, 1977, now abandoned, which is a continuation-in-part of application Ser. No. 588,390, filed June 18, 1975, now U.S. Pat. No. 4,040,870 which is a continuation-in-part of application Ser. No. 358,110 filed May 7, 1973, now abandoned.

BACKGROUND OF THE INVENTION

This invention relates to the production of hard alloy deposits which are generally used in the manufacture of heat and wear resistant parts and cutting tools. More particularly, the invention relates to the production of deposits of alloys on substrates, or the production of free standing objects made from a deposit after removal of said substrate. The deposits of the invention have physical characteristics which are substantially improved over those presently known to those skilled in the art.

There have been many efforts in the past to improve the superficial hardness and strength of heat and wear resistant parts and cutting materials. It is known that the introducion of certain alloying elements into the surfaces of wear resistant cutting materials will improve the hardness of such materials. Exemplary of such elements are carbon, nitrogen and boron which may be used individually or in combination with other elements.

The introduction of such alloying agents into the surface of wear resistant materials has been accomplished by a number of different methods. One such method is by diffusion of the alloying agents into the surface of the material. This may be accomplished in a gaseous environment by a process referred to as "metallizing", or by a molten salt electrolysis referred to as "metalliding".

Another method which may be used separately from or subsequent to the aforesaid diffusion method is that of "over-coating" alloys onto the surface of such wear resistant materials. This involves the use of such materials as chromium carbide, titanium nitride, or titanium carbide which are deposited on the wear resistant materials to a thickness of about 1 to 10 microns, or as much as several hundred microns. These "over-coatings" may be applied by any one of the techniques known in the art as flame spraying, plasma arc spraying, reactive evaporation, sputtering, physical vapor deposition, or chemical vapor deposition.

The foregoing methods have generally improved the hardness of such wear resistant materials but have not made any significant improvement in the toughness or strength of such materials. In addition, alloys deposited by any of the foregoing materials have been found to have strengths that are generally less than the same alloys made by the techniques of forging, casting, or powder consolidation.

Accordingly, an objective of the invention is to improve the strength and toughness of such deposits whether they be used as coatings or as free standing bodies.

Another objective of the invention is to produce deposits of higher hardness than that achieved by conventional methods.

A further objective of the invention is to provide deposits with closely controlled compositions on extended areas of surface thereby to enhance their uniformity and chemical stability.

SUMMARY OF THE INVENTION

The method of the present invention is similar to conventional chemical vapor deposition, referred to herein as CVD, but is distinguished therefrom and from said prior art techniques, in that the present invention produces extremely fine, substantially equiaxial grains. This is to be distinguished from the grains produced by CVD and the other prior art techniques which produced either long columnar grains or large equiaxial grains. The production of deposits having the relatively fine, substantially equiaxial grains of the present invention produces wear resistant coatings which are harder, stronger, or tougher than coatings of the same materials produced by the aforesaid prior art techniques.

The grains or crystals produced by the method of the present invention generally have an average diameter on the order of about 0.1 to 0.25 micron or less, but may range up to about 1 micron in average diameter. This is to be distinguished from the grain size produced by the aforesaid prior art techniques which are substantially greater than 1 micron in average diameter and usually have average diameters in the order of magnitude of hundreds of microns.

CVD and the method of the present invention both deposit metal derived from vaporized metal halides. In CVD, the deposition generally occurs by completely reducing a metallic halide to produce a metallic deposit on a substrate. In the method of the present invention, however, the metallic halide is first partially reduced in a first reaction zone separated from the substrate, and then introduced into a second reaction zone provided with an alloying gas and deposited as a liquid phase intermediate compound onto the substrate. The formation of the liquid phase intermediate compound controls the nucleation of the grains and prevents the formation of large or long columnar grains which are produced by CVD. The liquid phase intermediate compound is thereafter thermochemically reacted to produce the hard, fine grained alloy of the present invention.

The partial reduction of metal halides in a first reaction zone separated from the substrate—referred to as being "off the substrate"—and the deposition of a liquid phase intermediate compound on the substrate, are features lacking in conventional CVD which exercises less control than the present invention over the nucleation of the grains. For the sake of convenience and to distinguish the method of the present invention from CVD, the method of the present invention is referred to as CNTD which stands for controlled nucleation thermochemical deposition, a shorthand expression used by the inventor to refer to his invention.

The CNTD method of the present invention generally is not limited to the use of metallic halides but also employs volatile halides of semi-metals. The term alloy is used in its broadest sense herein, and is meant to include solid solutions, chemical compounds, or mixtures of solid solutions and chemical compounds.

The term substrate is used herein in its broadest sense and is intended to include any form upon which the coating is deposited, whether subsequently used in the bonded condition or dispensed with after deposition such as a mandrel or die.

The liquid phase intermediate compound contains at least one alloying agent but may contain more. The thermochemical reaction which converts said liquid phase to a hard, fine grained alloy is achieved by pyrolysis or by reaction with the alloying gas, depending upon the particular intermediate compound deposited on the substrate.

The metals or semi-metals contemplated for use in practicing the present invention are capable of forming a volatile halide in gaseous form as a condition precedent to deposition on the substrate. The gaseous alloying agents contain suitable elements selected from the class consisting of boron, carbon, silicon, or nitrogen, to produce the corresponding boride, carbide, silicide, or nitride, when alloyed with the metal or semi-metal derived from the volatile halides. Oxygen may be one of the alloying agents when more than one alloying agent is used.

Exemplary of the metals for use in practicing the present invention are aluminum and certain of the transition metals of Groups IVb, Vb, and VIb, namely titanium, zirconium, and hafnium of Group IVb, vanadium, columbium, and tantalum of Group Vb, and chromium of Group VIb.

The semi-metals contemplated for use in practicing the present invention are boron and silicon. These elements generally behave as semi-metals, but, when silicon is reacted with an alloying agent comprises of carbon, nitrogen, or boron, and when boron is reacted with an alloying agent comprised of carbon, or nitrogen and silicon, they behave in the same way as metals and produce a hard alloy as contemplated by the present invention.

The alloying agents contemplated for use in practicing the present invention may be introduced into the deposition system in a number of ways. Elemental boron, carbon, or silicon may be combined with a halogen to produce volatile halides. These halides may then be injected into the gas stream. Nitrogen may be injected as gaseous elemental nitrogen, ammonia, hydrazine, or in some cases, as an amine. Silicon or boron may be introduced as hydrides, such as silane or diborane. Substituted hydrides, such as trichlorosilane and methyltrichlorosilane, may also be used as a source of silicon, and carbon and silicon, respectively. Methyltrichlorosilane may thus function as a source of the semi-metal, silicon, and as a source of the alloying agent carbon after partial reduction and introduction into the second reaction zone.

The alloying agent may also comprise a mixture of separate alloying agents, and when it does, the resultant hard metal coating may contain a mixture of alloying elements or it may contain only one alloying element if the metal or semi-metal has a preference for reacting with only one of the alloying elements. Thus, when methyltrichlorosilane is used as a source of the semi-metal silicon, and the alloying agent carbon, it has been found that when ammonia $NH_3$ is also introduced in the second reaction chamber, the resultant coating has been analyzed to be silicon nitride, only, without any carbon present, thus demonstrating a preference of silicon to react with nitrogen rather than carbon.

In addition to the specific metals, and semi-metals and alloying agents set forth herein for use in practicing the present invention, this invention is intended to cover the use of any other element capable of forming a volatile halide or any other alloying agent having the characteristics as aforesaid, which may be found by routine testing by one skilled in the art having the benefit of the teachings of this disclosure.

BRIEF DESCRIPTION OF THE DRAWING

The invention will be more specifically described in connection with the accompanying drawing, referred to as FIG. 1, which is a schematic diagram of a chemical vapor deposition apparatus employed in the practice of the method of the invention.

DETAILED DESCRIPTION OF THE INVENTION

Figure 1:
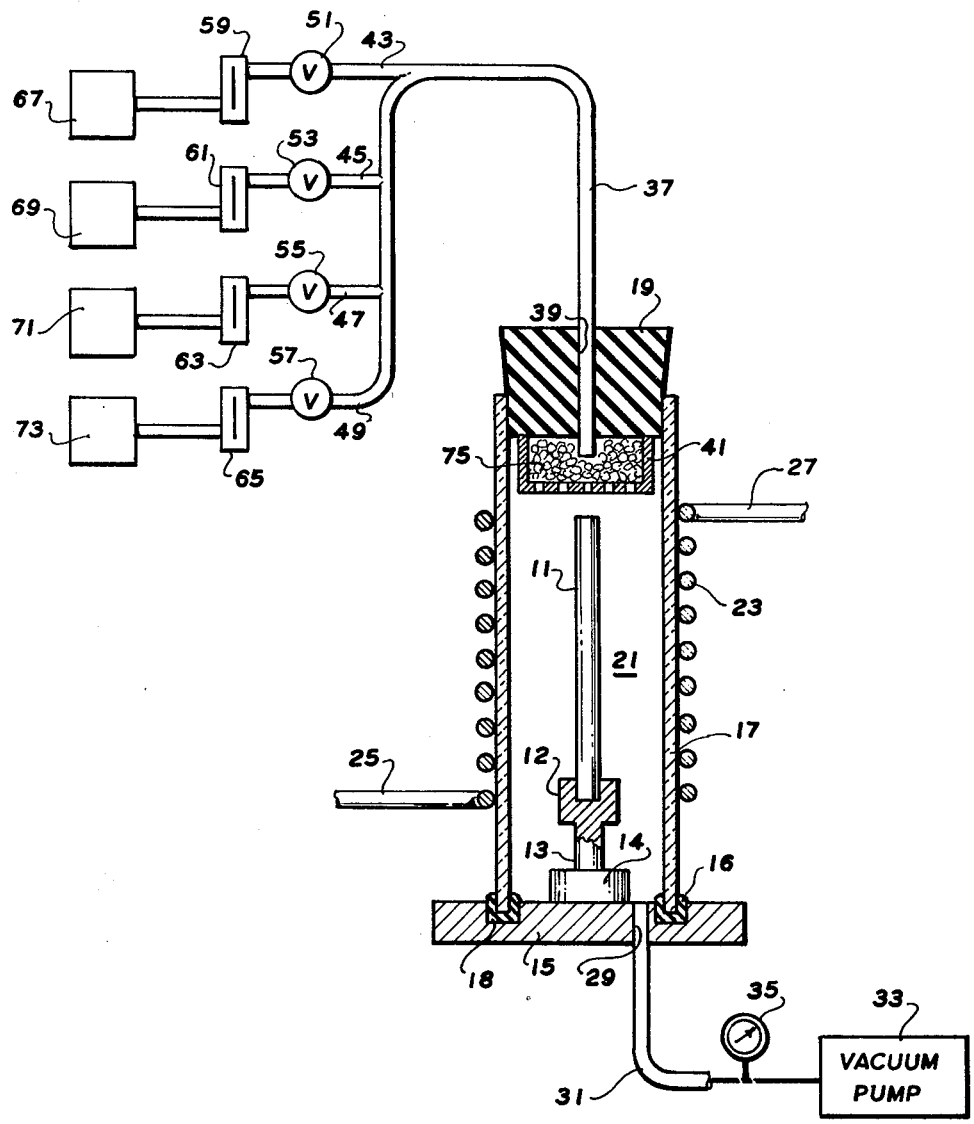

In practicing the CNTD method with the apparatus illustrated in the FIGURE, the hard deposit of the present invention is made upon a substrate 11 in the form of a cylindrical rod. The rod 11 is supported in a work holder or fixture 12 supported from a rod 13 resting on a disc-shaped base 14. The disc shaped base 14 is supported on a reactor base 15 which is provided with an annular groove 16 therein.

The reactor is completed by a heat-proof cylindrical walled tube 17 of quartz or similar material which seats in the annular groove 16 and is sealed therein by an annular seal 18. The top of the quartz tube 17 is closed by an elastomeric stopper 19 of conventional design removably secured therein. There is therefore defined a reaction chamber 21 in which the CNTD process takes place.

In order to heat the substrate 11 to the desired temperature, as will be explained, an induction heating coil 23 is provided surrounding the outer wall of the glass or quartz tube 17. The induction heating coil 23 is supported by means not shown and is provided with leads 25 and 27 to which the induction heating current is conducted from a suitable source, also not shown.

In order to regulate the pressure within the reaction chamber 21, the lower wall or base 15 of the reactor is provided with an opening 29 therein through which a tube 31 is passed. The tube 31 is suitably connected to a vacuum pump 23 and a vacuum gauge 35 is connected in the line thereto for indicating the pressure within the chamber 21. By properly operating the vacuum pump 33, the pressure within the chamber 21 may be regulated as desired.

A gas inlet tube 37 is provided in the elastomeric stopper 19 through a central opening 39 therein. There is optionally provided at the terminus of the tube 37 within the chamber 21, a porous basket 41 for purposes subsequently described. The tube 37 is connected through a plurality of tubes 43, 45, 47 and 49 to regulator valves 51, 53, 55 and 57 and flowmeters 59, 61, 63 and 65, respectively.

Sources of reactant gas 67, 69, 71 and 73 are connected to the flowmeters 59, 61, 63 and 65, respectively, for introducing the desired reactive gases within the chamber 21, as will be subsequently described.

A gas inlet tube 46 passes coaxially in the tube 37 and through the porous basket 41 to the region upstream of the substrate 11 in the reactor. The tube 46 is connected by tubes 47 and 49 to regulator valves 55 and 57, and flow meters 63 and 65, respectively. Sources 71 and 73 of reactant gases are connected to the flowmeters 63 and 65 for introducing reactant gases through the tube 46 to the chamber 21.

A gaseous halide of said metal or semi-metal from source 67 flows through tubes 43 and 37 and enters porous basket 41 which forms a first reaction zone. This first reaction zone is spaced from the surface of said substrate and separate from the reaction chamber 21 which constitutes a second reaction zone.

The gaseous halides are partially reduced in the first reaction zone by a reducing agent which may be in the form of a gas, such as hydrogen, or in the form of particulate matter 75 suspended in basket 41. If the reducing agent is a gas, said gas flows into basket 41 through tubes 45 and 46 from source 69. In either case, a partial reduction or disproportionation reaction occurs between said gaseous halide and the reducing agent to produce a lower halide of said metal or semi-metal. The chamber wall is kept at a sufficiently high temperature to minimize collection of the lower halide in the basket 41.

The alloying gas from source 71 flows into chamber 21 through tube 46. The partially reduced halide, as aforesaid, also flows into chamber 21, and is observed as a fog or smoke passing through the porous basket 41, forming a halo about the substrate 11 and depositing a liquid intermediate compound on the surface thereof.

Argon diluent gas is frequently used in the deposition system to control the heat flux in the boundary layer adjacent the surface of the substrate. Hydrogen is also used for this purpose in addition to its use as a reducing agent. When hydrogen is used as a reducing agent, partial reduction of the gaseous halides is provided by regulating the partial pressure of hydrogen within the system to provide a hydrogen pressure which is generally below the amount needed for total reduction of the halides. Partial reduction may also occur by using chips of the metal 75 in basket 41 corresponding to the volatile halide to be partially reduced, i.e., titanium chips are used to partially reduce titanium tetrachloride.

In using the apparatus illustrated in FIG. 1 to deposit a coating of titanium boride pursuant to the CNTD method of the present invention, a halide of titanium, such as titanium tetrachloride, is flowed into the first reaction zone and is reduced to a lower chloride of titanium. This lower chloride of titanium flows into the reaction chamber 21 and over the heated substrate 21, where it is deposited as liquid and reacts with boron trichloride to form a solid deposit. The existence of this intermediate step has been demonstrated both by direct observation of the liquid formation on the surface and by inferential data. Methods of effecting the partial reduction of titanium tetrachloride are the flowing of the titanium tetrachloride through a heated bed of titanium chips, or flowing a mixture of hydrogen and titanium tetrachloride over a heated surface of inert material such as alumina beads. The resultant solid deposit is either a smooth vitreous appearing coating or a fine botryoidal coating.

If the liquid phase intermediate compound is not formed, as, for example, by directly injecting titanium tetrachloride into the gas reaction chamber 21 without the necessary high temperature partial reduction, a typical CVD coarse hexagonal crystal of titanium boride is deposited. X-ray investigation demonstrates that either type of deposit is titanium diboride. There is, however, a very substantial difference in the properties of the deposits made by the CNTD method as compared to the CVD method. The deposits made by the CNTD method are extremely fine grain, circa 0.1 micron, are extremely hard by comparison with those made by CVD. The harder deposits regularly measure greater than $HV_{500}$ 4000 and have, in fact, been measured at hardnesses of over $HV_{500}$ 6000. The variation is due to the difficulty in the precise measurements of the thin coatings of such hard materials. By comparison, a typical crystalline, or conventional titanium diboride coating has a $HV_{500}$ of between 2800 and 3200. This latter hardness is the hardness generally accepted in the trade for titanium diboride.

The method of the invention for the deposition of the other metals and semi-metals disclosed herein is the same as described for the deposition of titanium boride hereinabove. The following examples serve to assist in an understanding of the invention. The deposits described in Examples 1, 2, 5, 6, 8, 9 and 11 to 18 were made pursuant to the CNTD method of the present invention. The deposits described in Examples 3, 4, 7 and 10 were not made pursuant to the present invention and are set forth herein for comparative purposes.

EXAMPLE 1. $TiB_2$

High-speed-steel drills having a diameter of 3 millimeters (mm) were first boronized by passing an 8:1 volume ratio mixture of hydrogen and boron trichloride over them at a temperature of 950° C. at a pressure of 200 Torr for 15 minutes. The drills were then racked in a furnace, heated to a temperature of 750° C. and maintained at a pressure of 200 Torr. Titanium tetrachloride at a flow rate of 100 milliliters per minute (ml/min) was passed through a bed of titanium chips at the same pressure, heated to 850° C. Boron tetrachloride at a flow of 400 ml/min and hydrogen at a flow of 800 ml/min. were mixed with the effluent from the chip bed and passed into the reactor furnace without cooling. In 40 minutes, a smooth, bright coating of 25 micron thickness adherent to the steel was produced. After coating, the parts were heated to 1150° C. and rapidly quenched in hydrogen gas to assure the hardness of the steel at Rockwell-C 65. The coating had a hardness of 7000 kg/mm² when measured with a 500 gram weight on a Vickers hardness tester. The drills successfully produced 9000 holes in laminated glass fiber printed circuit board material as compared with 30 holes before failure for similar drills uncoated. Metallographic sections of the deposit showed a lamellar deposit.

EXAMPLE 2. $TiB_2$

Cemented carbide rod of 1.5 mm diameter was coated in a manner similar to Example 1. No preliminary boronization was conducted. The titanium tetrachloride at 100 ml/min. and the hydrogen at 100 ml/min. were passed through a bed of alumina beads heated to 700° C. before mixing with the boron trichloride at 400 ml/min. The gas mixture was directly injected into the furnace in which the drill rod was mounted with the furnace held at 850° C. A coating of 25 microns thickness was made in 30 minutes. The coating was bright, smooth and adherent and had a Vickers hardness number of 6200 kg/mm² measured with a 500 gram weight. The metallographic sections showed the same lamellar structure.

EXAMPLE 3. $TiB_2$

The experiment of Example 1 was run again except that the titanium tetrachloride, hydrogen, and boron trichloride were directly injected into the furnace without any provision for preliminary reduction of the titanium tetrachloride. The surface of the carbide drill rod was slightly discolored but there was no measurable hardness increase. Metallographic examination showed only a slight coarsening of the grain boundaries near the surface and no well defined coating.

EXAMPLE 4. TiB$_2$

An experiment was run using direct injection of titanium tetrachloride at 100 ml/min., boron trichloride at 400 ml/min., and hydrogen at 1600 ml/min. into the reactor furnace. The specimens were 1.5 mm cemented carbide rods. The furnace was held at 1100° C. and the gases pumped off to maintain 200 Torr. After 60 minutes a bright coating of 6 microns was achieved. The coating had well developed columnar hexagonal crystals with a hardness of 2900 HV$_{500}$.

The above Examples 3 and 4 illustrate the necessity for the reaction of the titanium tetrachloride to form a layer chloride which is deposited as a liquid in accordance with the method of the invention. In Example 3, since there was no lower chloride formation and no possibility of the liquid deposition, no deposit was effected at the low deposition temperature. In Example 4, the temperature of deposition was too high to allow liquid deposition so that the mechanism for the deposit was one of ordinary CVD and the columnar crystals were in evidence.

EXAMPLE 5. TiC

The process of Example 1 was repeated using 3 mm diameter high speed steel drills. All conditions were the same except that carbon tetrachloride at a flow of 400 ml/min was used instead of boron trichloride. The coating had a hardness of 4500 kg/mm$^2$ when measured with a 500 gram weight on a Vickers hardness tester. Drills did not fail in 1000 hole tests on laminated glass fiber printed circuit board material.

EXAMPLE 6. TiSi$_2$

The process of Example 2 was repeated using silicon tetrachloride instead of boron trichloride. The coating was bright, smooth, and adherent with a hardness of 1650 HV$_{500}$. The metallographic section showed the lamellar structure, similar to that of FIG. 1.

EXAMPLE 7. TiSi$_2$

Example 6 was rerun using direct injection of titanium tetrachloride at 100 ml/min; tetrachloride at 50 ml/min; hydrogen at 4200 ml/min; and argon at 7000 ml/min. to approximate conventional chemical vapor deposition techniques. The resultant deposit at 950° C. to 1000° C. was fine crystalline in superficial appearance and had a hardness number of 950 HV$_{500}$. The cross section showed typical columnar grains.

Examples 6 and 7 show the difference between the method of the invention, wherein a layered deposit essentially free of columnar grains is formed from the intermediate liquid layer, and the conventional chemical vapor deposition method.

In performing the above Examples 1, 2, 5, and 6, the following reactions are believed to be representative of the deposition mechanism:

$$3TiCl_4(g) + Ti(s) \rightarrow 4TiCl_3(g)$$

or $$2TiCl_4(g) + H_2(g) \rightarrow 2TiCl_3(g) + HCl$$

In the gas stream plus $$TiCl_3(g) + \tfrac{1}{2}H_2 \rightarrow TiCl_2(l) + HCL$$

On the surface followed by $$2TiCl_2 \rightarrow Ti + TiCl_4, \text{ Reaction Products A}$$

$$3TiCl_2 + 2BCl_3 \rightarrow 2B + 3TiCl_4, \text{ Reaction Products B}$$

$$\text{Reaction Products A} + B \rightarrow TiB_2 + 4TiCl_4$$

The TiCl$_2$ is probably representative of a polymeric material such as (TiCl$_x$)$_y$ which is a liquid under deposition conditions.

EXAMPLE 8. CbC

Using a substrate of 1.25 cm diameter round molybdenum bar, an experiment was conducted to deposit columbium pentachloride at a flow of 400 ml/min. was passed through a bed of columbium chips heated to 1200° C. The resultant columbium trichloride was mixed with 600 ml/min. of hydrogen and 800 ml/min. of carbon tetrachloride. The mixed gas stream was passed over the substrate which was held at 900° C. Gases were pumped off to maintain a pressure of 300 Torr. Columbium carbide was deposited at a rate of 18 microns per minute for 20 minutes. The deposit has a HV$_{500}$ hardness of 3200. The grain structure was fine and equiaxial. The average grain size as less than 1 micron. There was no evidence of columnar crystals. It may be noted that columbium carbide made by conventional chemical vapor deposition would be columnar and would deposit at approximately one-tenth this rate at this temperature.

EXAMPLE 9. TaSi$_2$

Tantalum silicide was deposited on a carbide disc of 25 microns diameter by 6 mm thick using a technique similar to Example 4. Tantalum pentachloride was passed through a heated bed of tantalum chips at 1200° C. and then mixed with silicon tetrachloride. The rates of flow were tantalum pentachloride 600 ml/min., silicon tetrachloride 600 ml/min. and hydrogen 1800 ml/min. 0.5 mm of deposit was effected in 36 minutes at 950° C. A fine grain deposit with less than one micron crystallites was obtained free of columnar orientation. The HV$_{500}$ hardness was 1600. The deposited surface was extremely smooth, having a surface of better than 4 rms. The only irregularities were a few well rounded hemispheres which had the appearance of frozen droplets and which are frequently experienced by the method of the invention.

EXAMPLE 10. TaSi$_2$

The conditions of Example 9 were reproduced except that the tantalum pentachloride was not passed through the heated bed of tantalum chips. After 36 minutes of operation no detectable deposit was observed on the substrate.

EXAMPLE 11. SiC

Deposits of fine grain silicon carbide were made by the following method: Silicon tetrachloride at a flow rate of 300 ml. per minute was mixed with a hydrogen stream of at least 300 ml. per minute and this mixture passed through a preliminary heated zone of the reaction chamber such as to heat the mixture to 600° C. A stream of propane at 68 ml. per min. was then added to the stream and the mixed gases passed over a resistantly heated tungsten wire maintained at 1150° C. The total pressure was 500 Torr. Silicon carbide was deposited on the wire at a rate of 0.25 mm per hour. This silicon carbide had an average grain size of 0.05 microns, a hardness of 4200 $HV_{500}$, and a Rupture Modulus in bending of 2400 MPa. The as-deposited surface was extremely smooth and the general appearance, vitreous. X-ray diffraction indicated, however, that the material was pure crystaline silicon carbide. Cooled portions of the chamber were covered with a yellow viscous liquid which contained about 23% silicon and 77% chloride by weight. The test was repeated using identical conditions except without preheating the mixed silicon tetrachloride and hydrogen stream. The silicon carbide was deposited at the same rate except coarse columnar grains resulted in the deposit and the Rupture Modulus of the material was 725 MPa. The surface topography now showed a rough crystalline surface.

EXAMPLE 12. SiC

The experiment of Example 11 was repeated using trichlorosilane as a source of silicon. Part temperature was held at 1150° C. and the total pressure at 250 torr. Similar fine grain deposits of silicon carbide resulted of nearly identical strength and hardness at a deposition rate of 0.5 mm per hour.

The experiment of Example 12 was repeated using methyltrichlorosilane as a source of silicon and omitting the propane from the gas stream with the same results. In all cases, the yellow viscous liquid was observed. The experiment was repeated with methyltrichlorosilane without preheating the mixed hydrogen and methyltrichlorosilane stream. No yellow viscous liquid was observed. Deposits were all coarse columnar morphology, typical of chemical vapor deposits. The Rupture Modulus in bending was 860 MPa.

EXAMPLE 13. $Si_3N_4$

Using an experimental arrangement identical to that used for silicon carbide deposits, the following experiment was conducted. A mixture of silicon tetrachloride at 275 ml. per minute with a like flow of hydrogen was premixed and heated to 600° C. 100 ml. per minute of ammonia having been preheated to the same temperature was then added down-stream of the heater and the total mixture passed over a graphite rod inductively heated to 1250° C. The total pressure in the chamber was 75 torr. A deposit of 0.5 mm thickness of silicon nitride was made on the graphite rod in three hours. The silicon nitride deposit was composed of crystallites of less then 1 micron with a smooth botryoidal surface topography. The material was heat treated at 1500° C. for 3 hours to assure conversion of any unreacted deposited species and to relieve any internal stress as deposited. The Rupture Modulus of the resulting material was 1030 kPa, and the hardness 3800 $HV_{500}$.

The experiment was repeated without preheating the gas streams and the resultant deposit consisted of poorly bonded, cracked, coarse grain crystals, too weak to make strength or hardness measurements.

EXAMPLE 14. AlN

The experiment of example 13 was repeated using the following conditions: 92 ml. per minute of aluminum chloride was mixed with 300 ml. per minute of hydrogen. The total pressure in the chamber was 300 torr. The mixed stream of the aluminum chloride and hydrogen was heated to 600° C. and then mixed with a preheated stream of 50 ml. per minute of ammonia. At a substrate temperature of 1060° C., a deposition rate of 0.25 microns per hour was achieved. The resulting deposit was smooth, having average grain size of 0.1 microns. The X-ray diffraction showed the material to be stochiometric aluminum nitride. The hardness of the deposit was 1600 $HV_{500}$.

EXAMPLE 15. $Al_xO_yN$

The above experiment (Example 14) was repeated under identical conditions except that 50 ml. per minute of carbon dioxide was added to the preheated mixed stream. A similar fine grain deposit resulted except that the hardness was increased to 2400$HV_{500}$. The deposit is believed to be on alloy containing Al, O, and N.

EXAMPLE 16. $Si_xN_yO$

An experiment was conducted in which a stream of 140 ml. per minute of silicon tetrachloride was mixed with a like amount of hydrogen preheated to 700° C. and thence mixed with a preheated stream of 70 ml. per minute of ammonia plus 15 ml. per minute of oxygen. The graphite rod part temperature was held at 1400° C. by induction heating. The total pressure was 50 torr. A deposit containing silicon, nitrogen and oxygen was made at a rate of 0.5 mm. per hour. Deposits had grain size of less than 0.5 micron.

EXAMPLE 17. $Si_xAl_yO_zN$

An experiment was conducted in which a stream of 600 ml. per minute silicon tetrachloride, 100 ml. per minute of aluminum trichloride, 800 ml. of hydrogen were preheated to 700° C., and subsequently mixed with a preheated stream of 100 ml. per minute of ammonia and 20 ml. per minute of oxygen. The total pressure in the chamber was 50 torr. The graphite rod substate was was held at 1325° C. A dense fine-grain, coherent deposit containing silicon, aluminum, oxygen, and nitrogen was made at a rate of 0.25 mm per hr. The deposit showed an X-ray diffraction pattern of beta silicon nitride and was, therefore, presumed to be a material, reported by several investigators, as beta SIALON.

EXAMPLE 18. $ZrB_2$

Example 1 was repeated except that the interior of 0.938 cm Zircalloy tubes, 15 cm long, were coated with $ZrB_2$. The surfaces of the tubes were first boronized using a mixture of 100 ml/min of $BCl_3$ and 4600 ml/min of $H_2$. The pressure was 250 torr and the temperature of the tubes was 950° C. After 15 minutes, 400 ml per minute of $Cl_2$ as added to a heated zirconium metal chip bed. The zirconium ignited and the effluent gas, believed to be $ZrCl_3$ was added to the deposition gas stream. After 30 minutes, the $Cl_2$ flow was increased to 800 ml/min. The resultant deposit was a bright metallic coating of 40 mm thickness having a hardness of $HV_{500}$ of $7500^{kg}/mm^2$. The total time for experiment was 45 minutes.

If a substrate cannot be heated by the passage of an electrical current through the substrate or by induction heating, a hot wall reactor, such as used in Examples 11, 12, and 13, is used to supply the necessary heat to the system. When using a hot wall reactor, it was found that the ratio of other reactants and gas streams had to be modified to achieve satisfactory results as compared to the ratio of reactants and gas streams used with substrates which were heated by an electrical current or by induction. Such modifications are readily determined empirically by trial and error and are within the ordinary skill of the art.

In addition to the superior coatings produced by the CNTD method of the present invention, the CNTD method has also been found to be advantageous in terms of the temperature and rate at which the deposits are produced. It is well known that titanium carbide deposits made by conventional CVD are regularly conducted in the range of 900° C. to 1200° C. and require several hours to produce a coating in the order of 10 microns in thickness. The CNTD method, however, has been able to produce superior titanium carbide deposits of 10 microns in thickness at temperatures as low as 750° C. in as little time as about 40 minutes.

In practicing the present invention, best results in terms of producing a hard deposit and reproducibility of results were achieved using the halides of aluminum, titanimum, zirconium, hafnium and silicon as the source of the metallic component of the hard metal alloy deposited on the substrate. The halides of columbium, tantalum and boron were also found to work as the metallic component but not as well as aluminum, titanium, zirconium, hafnium or silicon. Results using the halides of columbium, tantalum and boron were not always uniform. Results using the halides of columbium and tantalum were improved when the halide is reacted with a silicon halide to produce a hard metal alloy on the substrate.

The invention provides an improved method for producing a coated substrate, as well as improved quality coated substrates. By providing an intermediate liquid phase on the surface of the substrate being coated, pyrolyzing this liquid or reacting a gas therewith to produce the final coating composition, the structure of the coating composition is such as to provide superior physical qualities. The deposits of the invention are smooth surface fine grained randomly distributed crystals free of columnar orientation and having a very high modulus of rupture. Other metal and semi-metal systems can also be effectively improved in their deposit quality in accordance with the invention. Parameters necessary to do this are readily determinable by those skilled in the art from the information contained herein combined with that contained in "Techniques of Metals Research" R. F. Bunshah, Ed., Intersciences Publishers, Div. of J. Wylie and Sons, New York, New York, 1968, Volume 1, Chapter 33.

Various modifications of the invention in addition to those shown and described herein will become apparent to those skilled in the art from the foregoing description and accompanying drawings. Such modifications are intended to fall within the scope of the appended claims.

I claim:

1. A method for depositing a hard, fine grained alloy onto a substrate, comprising providing a volatile, gaseous halide of a metal or semi-metal, partially reducing the volatile halide in a first reaction zone by a gaseous reducing agent or particulate metal or semi-metal which is the same as the metal or semi-metal of the volatile halide to be reduced, said first reaction zone having a first pressure and separated from the surface of said substrate, flowing said partially reduced halide into a second reaction zone maintained at a pressure lower than the pressure in said first reaction zone and containing said substrate, providing a gaseous alloying agent in said second reaction zone, and depositing a liquid phase intermediate compound onto a substrate within said second reaction zone, and thermochemically reacting the liquid phase on the substrate to produce the fine grained alloy.

2. A method according to claim 1 wherein said metal is selected from the class consisting of aluminum, zirconium, hafnium, vanadium, columbium, tantalum and chromium, said semi-metal is selected from the class consisting of boron and silicon, and said alloying agent furnishes an alloying element selected from the class consisting of nitrogen, boron, carbon and silicon.

3. A method according to claim 1 or claim 2 wherein said alloying agent furnishes oxygen as an alloying element in addition to at least one of the alloying elements set forth in claim 2.

4. A method according to claim 1 or claim 2 wherein said metal is aluminum.

5. A method according to claim 1 or claim 2 wherein said metal is zirconium.

6. A method according to claim 1 or claim 2 wherein said metal is hafnium.

7. A method according to claim 1 or claim 2 wherein said metal is vanadium.

8. A method according to claim 1 or claim 2 wherein said metal is columbium.

9. A method according to claim 1 or claim 2 wherein said metal is tantalum.

10. A method according to claim 1 or claim 2 wherein said metal is chromium.

11. A method according to claim 1 or claim 2 wherein silicon is acting as said metal.

12. A method according to claim 1 or claim 2 wherein boron is acting as said metal.

13. A method according to claim 1 or claim 2 wherein said alloying element is boron.

14. A method according to claim 1 or claim 2 wherein said alloying element is carbon.

15. A method according to claim 1 or claim 2 wherein said alloying element is silicon.

16. A method according to claim 1 or claim 2 wherein said alloying element is nitrogen.

17. A method according to claim 1 or claim 2 wherein said hard alloy is comprised of silicon and carbon.

18. A method according to claim 1 or claim 2 wherein said hard alloy is comprised of silicon and nitrogen.

19. A method according to claim 1 or claim 2 wherein said hard alloy is comprised of silicon, nitrogen and oxygen.

20. A method according to claim 1 or claim 2 wherein said hard alloy is comprised of aluminum and nitrogen.

21. A method according to claim 1 or claim 2 wherein said hard alloy is comprised of silicon, aluminum, nitrogen and oxygen.

22. A method according to claim 1 or claim 2 wherein said hard alloy is comprised of zirconium and boron.

23. A method for producing a hard, fine grained alloy on a substrate, comprising placing the substrate in a chemical vapor deposition reactor and heating the substrate to a temperature of between about 650° and about 950° C., providing a flow in the reactor of a gaseous volatile halide of a metal selected from the class consisting of aluminum zirconium, hafnium, vanadium, columbium, tantalum, and chromium, partially reducing the volatile halide to a lower halide in a first reaction zone by a gaseous reducing agent or a particulate metal which is the same as the metal of the volatile halide to be reduced, said first reaction zone having a first pressure and separated from said substrate, flowing said lower halide into a second reaction zone maintained at a pressure lower than the pressure in said first reaction zone, providing in said second reaction zone a gaseous alloying agent which furnishes an alloying element selected from the class consisting of nitrogen, boron, carbon and silicon, and controlling the substrate temperature, the reactor pressure and the relative amounts of said metal and said alloying agent to cause the deposition on the substrate of a compound of said metal which is in a liquid phase, and thermochemically reacting said liquid phase to said hard, fine grained alloy.

24. A method for providing a hard fine grained alloy on a substrate, comprising placing the substrate in a chemical vapor deposition reactor and heating the substrate to a temperature of between about 1000° C. and about 1600° C., providing a flow in the reactor of a gaseous volatile halide of a semi-metal selected from the class consisting of silicon and boron, partially reducing the volatile halide to a lower halide in a first reaction zone by a gaseous reducing agent or a particlate semi-metal which is the same as the semi-metal of the volatile halide to be reduced, said first reaction zone having a first pressure and separated from said substrate, flowing said lower halide into a second reaction zone maintained at a pressure lower than the pressure in said first reaction zone, providing in said second reaction zone a gaseous alloying agent which furnishes an alloying element selected from the class consisting of nitrogen, boron, carbon and silicon, and controlling the substrate temperature, the reactor pressure and the relative amount of said semi-metal and said alloying agent to cause the deposition on the substrate of a liquid phase intermediate compound, and thermochemically reacting said liquid phase to a hard fine grained alloy.

25. A method according to claim 24 wherein said alloying agent furnishes oxygen as an alloying element in addition to at least one of the alloying elements set forth in claims 24.

26. A method for depositing a hard fine grained alloy of titanium and nitrogen onto a substrate comprising, providing a volatile gaseous halide of titanium, partially reducing said halide to form a lower halide of titanium in a first reaction zone by a gaseous reducing agent or particulate titanium, said first reaction zone having a first pressure and separated from said substrate, flowing said lower halide into a second reaction zone maintained at a pressure lower than the pressure in said first reaction zone, providing in said second reaction zone a gaseous alloying agent containing nitrogen, depositing a liquid phase intermediate compound on said substrate and thermochemically reacting said liquid phase to produce said hard, fine grained alloy.

27. A hard metal alloy produced from a volatile halide of a metal partially reduced to form a liquid compound containing said alloy which is deposited onto a substrate and thermochemically reacted to produce said alloy, said alloy comprised of a metal selected from the class consisting of aluminum, hafnium, columbium, zirconium and tantalum, and an alloying element selected from the class consisting of nitrogen, boron, carbon and silicon, said alloy being free of columnar crystals and having a crystal structure consisting of fine and substantially equiaxial grains less than about 1 micron in diameter.

28. A hard silicon alloy produced from a volatile halide of a silicon partially reduced to form a liquid compound containing silicon deposited onto a substrate and thermochemically reacted to produce said alloy, said alloy comprised of silicon and an alloying element selected from the group consisting of nitrogen, boron and carbon, said alloy being free of columnar crystals and having a crystal structure consisting of fine and substantially equiaxial grains having an average diameter of less than about 0.25 micron.

29. A hard boron alloy produced from a volatile halide of boron partially reduced to form a liquid compound containing boron deposited onto a substrate and thermochemically reacted to produce said alloy, said alloy comprised of boron and an alloying agent selected from the group consisting of nitrogen, silicon and carbon, said alloy being free of columnar crystals and having a crystal structure consisting of fine and substantially equiaxial grains having an average diameter of less than about 0.25 micron.

* * * * *

UNITED STATES PATENT AND TRADEMARK OFFICE
CERTIFICATE OF CORRECTION

PATENT NO. : 4,239,819
DATED : Dec. 16, 1980
INVENTOR(S) : Robert A. Holzl

It is certified that error appears in the above—identified patent and that said Letters Patent is hereby corrected as shown below:

```
Col.  1,  line 58,  "materials" should be --methods--.
Col.  3,  line 28,  "comprises" should be --comprised--.
Col.  4,  line 40,  "23" should be --33--.
Col.  5,  line 4,   "reaction" should be --reduction--.
Col.  7,  line 16,  "layer" should be --lower--.
Col.  8,  line 25,  "has" should be --had--;
          line 27,  "as" should be --is--.
Col. 10,  line 15,  "on" should be --an--;
          line 37,  "substate" should be --substrate--;
          line 38,  delete "was";
          line 52,  "as" should be --was--.
Col. 13,  line 37,  "claims" should be --claim--.
```

Signed and Sealed this

Fourteenth Day of April 1981

[SEAL]

Attest:

RENE D. TEGTMEYER

Attesting Officer     Acting Commissioner of Patents and Trademarks